United States Patent
Wang et al.

(10) Patent No.: US 8,563,231 B2
(45) Date of Patent: Oct. 22, 2013

(54) PATTERNING PROCESS AND MATERIALS FOR LITHOGRAPHY

(75) Inventors: Chien-Wei Wang, Wufong Township, Taichung County (TW); Ko-Bin Kao, Shengang Township, Taichung County (TW); Wei-Liang Lin, Hsin-Chu (TW); Jui-Ching Wu, Hsinchu (TW); Chia-Hsiang Lin, Zhubei (TW); Ai-Jen Jung, Zhushan Township, Nantou County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 98 days.

(21) Appl. No.: 13/240,909

(22) Filed: Sep. 22, 2011

(65) Prior Publication Data

US 2013/0075364 A1    Mar. 28, 2013

(51) Int. Cl.
  *G03F 7/00* (2006.01)
  *G03F 7/20* (2006.01)
  *G03F 7/40* (2006.01)

(52) U.S. Cl.
  USPC ............ 430/331; 430/270.1; 430/271.1; 430/330; 430/394

(58) Field of Classification Search
  USPC ............ 430/270.1, 394, 273.1, 330, 331
  See application file for complete search history.

(56) References Cited

U.S. PATENT DOCUMENTS

| | | | | |
|---|---|---|---|---|
| 6,677,106 B2 * | 1/2004 | Blum et al. | .................. | 430/302 |
| 7,829,269 B1 * | 11/2010 | Fonseca et al. | ............... | 430/394 |
| 8,012,675 B2 * | 9/2011 | Yang | ............................ | 430/323 |
| 8,124,326 B2 * | 2/2012 | Shirley et al. | ................. | 430/322 |
| 8,129,080 B2 * | 3/2012 | Fonseca et al. | ................. | 430/30 |
| 8,338,086 B2 * | 12/2012 | Carcasi et al. | ............... | 430/322 |
| 2004/0152024 A1 * | 8/2004 | Livesay et al. | ............... | 430/394 |
| 2010/0068657 A1 * | 3/2010 | Yang | ............................ | 430/323 |

OTHER PUBLICATIONS

Adam S. Zerda et al., "Characteristics of Antiplasticized Thermosets: Effects of Network Architecture and Additive Chemistry on Mechanical Fortification", Polymer Engineering and Science, Nov. 2004, vol. 44, No. 11, 2004 Society of Plastic Engineers, pp. 2125-2133.

* cited by examiner

*Primary Examiner* — Amanda C. Walke
(74) *Attorney, Agent, or Firm* — Haynes and Boone, LLP

(57) ABSTRACT

Methods for forming a pattern in a lithography process for semiconductor wafer manufacturing are provided. In an example, a method includes forming a photoresist layer over a material layer; performing a first exposure process on the photoresist layer, thereby forming an exposed photoresist layer having soluble portions and unsoluble portions; treating the exposed photoresist layer, wherein the treating includes one of performing a second exposure process on the exposed photoresist layer and forming an adsorbing chemical layer over the exposed photoresist layer; and developing the exposed and treated photoresist layer to remove the soluble portions of the photoresist layer, wherein the unsoluble portions of the photoresist layer form a photoresist pattern that exposes portions of the material layer.

22 Claims, 9 Drawing Sheets

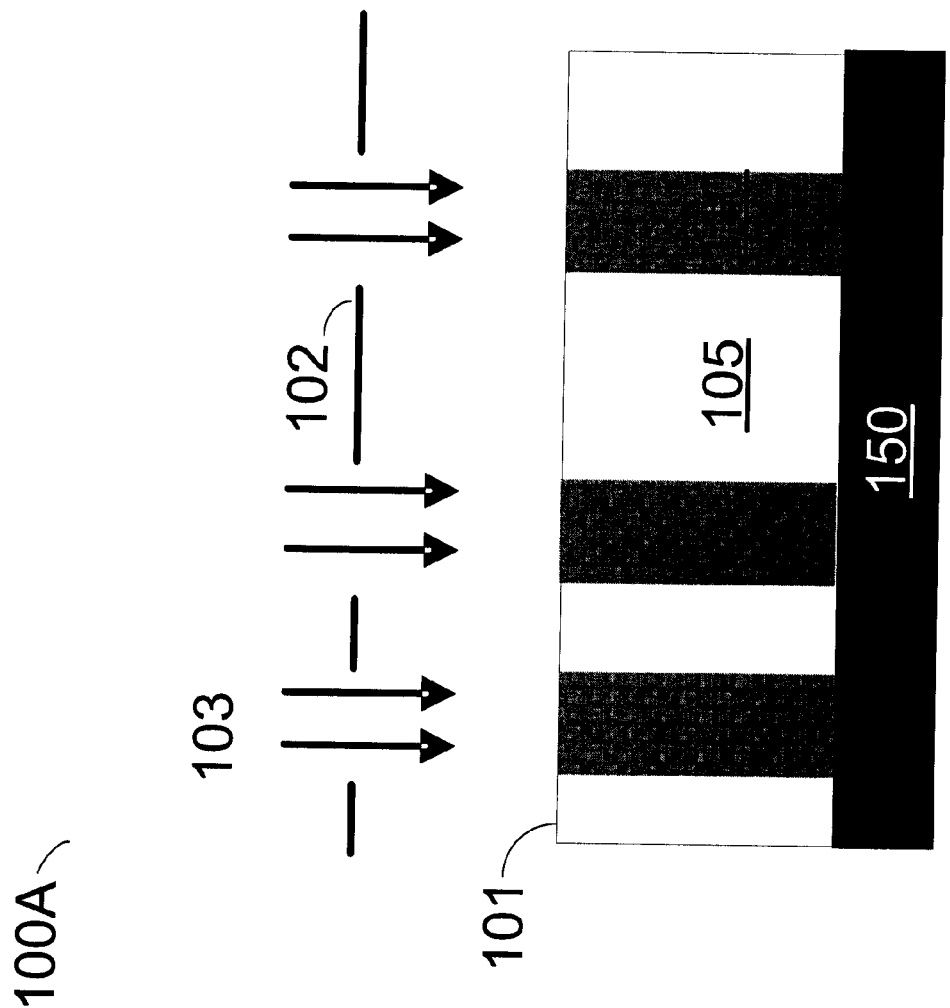

PATTERNING PROCESS AND MATERIALS FOR LITHOGRAPHY

BACKGROUND

In many instances of photolithography a photoresist residue adheres to the photoresist pattern and becomes a defect if it is not properly removed before etching. To mitigate this problem, conventional techniques use a cleaning agent during a post-development cleaning step to remove the photoresist residue. In conventional post-development cleaning procedures, a cleaning agent used may include additives such as a surfactant. However, such surfactants tend to penetrate into the photoresist and damage the photoresist pattern desired to be imprinted on the substrate, leading to defects. For example, some additives may have the effect of inducing a drop in polymer glass transition temperature (Tg), leading to photoresist pattern distortion. Accordingly, it is desirable to have a method, tools, and materials for improving lithography procedures.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIG. 1A shows a partial view of a step in a lithography method, according to some embodiments.

DETAILED DESCRIPTION

Figure 1B:
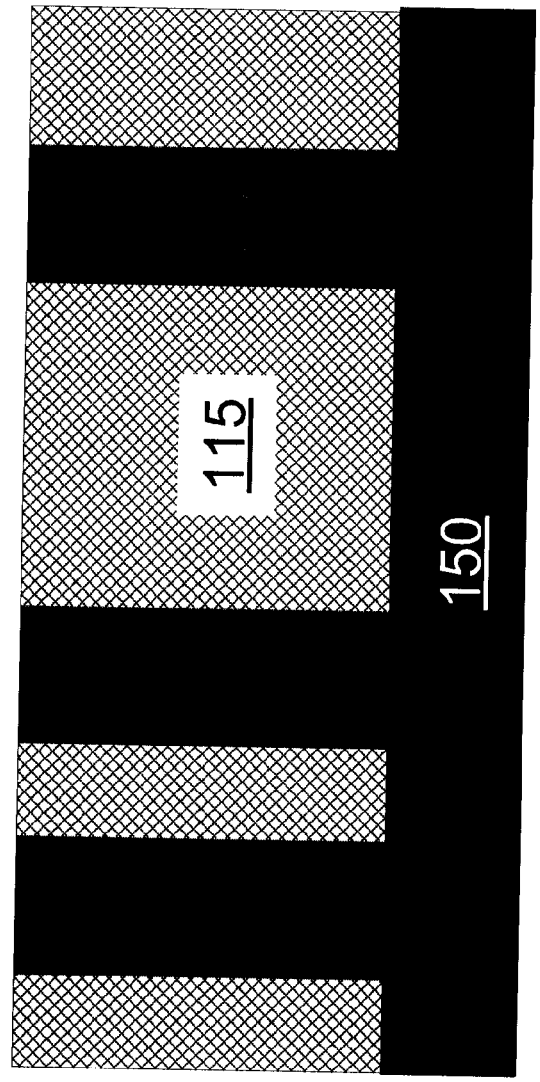
FIG. 1B shows a partial view of a pre-development step in a lithography method, according to some embodiments.

The present disclosure relates to methods and tools for semiconductor manufacturing. More particularly, the present disclosure relates to methods, tools, and materials for lithographic pattern formation in semiconductor manufacturing. It is understood that the present disclosure provides many different forms and embodiments, and that specific embodiments are provided only as examples. Further, the scope of the present disclosure will only be defined by the appended claims. In the drawings, the sizes and relative sizes of tools, parts and components may be exaggerated for clarity. It will be understood that when an element or component is referred to as being "on," "connected to" or "coupled to" another element or component, it may be directly on, connected to, or coupled to the other element or component, or intervening elements or components may be present.

In photolithography techniques according to embodiments disclosed herein, a photoresist layer is illuminated with light (typically in the ultraviolet (UV) wavelength range) through an opaque or partially opaque mask. The photoresist layer may include a polymer, a photoacid generator (PAG), a quencher, a chromophore, and a surfactant. The electromagnetic wave may photo-excite the PAG, thereby producing an acid. The acid compound acquires a spatial distribution substantially similar to a negative of the mask projected on the photoresist. Thus, the portion of photoresist that is not irradiated with light may form a photoresist pattern. At a development step, the irradiated photoresist is combined with a developer solution having a component that is basic. After a post-exposure baking process, the photoresist layer in the exposed area is substantially dissolved in a basic solution, forming photoresist residue. In a post-development cleaning process, the dissolved photoresist and photoresist residue are removed, leaving a photoresist pattern ready for an etching step. Embodiments of photolithography methods disclosed herein enable the removal of residual photoresist particles that otherwise may contaminate the photoresist pattern in a subsequent etching step.

Hereinafter, embodiments of the present invention will be explained in detail with reference to the accompanying drawings. FIGS. 1A-4 show a photoresist pattern that is a direct image of a mask used to expose the photoresist during an exposure process. In embodiments consistent with FIGS. 1A-4, photoresist portions irradiated with light are dissolved away in a development step and are removed from the photoresist pattern, which may be used as an etching mask during an etching step. Some embodiments consistent with the concepts disclosed herein may produce a photoresist pattern that is a negative image of the mask used to expose the photoresist during the exposure process. In such embodiments, photoresist portions that are not irradiated with light are dissolved away in a development step and thus are removed from the photoresist pattern that may be used as an etching mask during an etching step.

A photoresist layer can be a negative-type resist layer or a positive-type resist layer. When the photoresist layer is exposed to radiation using a mask having opaque or partially opaque portions and gaps, there are exposed portions and unexposed portions in the photoresist layer. If the photoresist is negative-type, the exposed portions become insoluble in a pre-selected solvent. If the photoresist is positive-type, the exposed portions become soluble in a pre-selected solvent. Embodiments of the present disclosure are described in detail using a positive-type photoresist layer as a example. Descriptions and concepts disclosed herein generally apply in a like manner to methods, tools, and materials used in conjunction with a negative-type PR layer.

FIG. 1A shows a partial view of a step 100A in a lithography method, according to some embodiments. In FIG. 1A, step 100A includes forming a photoresist layer 101 on a substrate 150. The substrate 150 may alternatively be referred to as a material layer, or the substrate 150 may include a material layer upon which features will be formed, or in which a pattern will be transferred (for example, by etching). In an example, the material layer is a metal layer, a semiconductor layer, or a dielectric layer. In another example, the material layer is a hard mask layer, such as a silicon oxide layer or a silicon nitride layer.

Step 100A includes a light exposure on the photoresist layer 101. For example, in embodiments consistent with FIG. 1A, the photoresist layer 101 is exposed to an electromagnetic radiation 103 through a photomask 102. Mask 102 may include opaque or partially opaque regions, and gaps. The opaque or partially opaque regions in mask 102 block or partially block radiation 103. The gaps in mask 102 allow portions of photoresist layer 101 to be exposed to radiation 103. As a result, a portion 110 of photoresist 101 is irradiated with radiation 103, and a portion 105 of photoresist layer 101 is not exposed to radiation 103. Thus, portion 105 remains substantially unaffected by radiation 103. According to some embodiments, radiation 103 may include UV radiation in the wavelength range from about 150 nm to 400 nm. For example, some embodiments may use radiation 103 including a narrow portion of the UV spectrum between about 150 nm and 400 nm, having a spectral bandwidth of about 1 nm or less.

According to some embodiments, irradiated portion 110 may be susceptible of being dissolved by a pre-selected solvent, thereby forming a soluble portion of photoresist layer 101. This may be the case when photoresist layer 101 is a positive-type photoresist layer, as in the depicted embodiment. For example, in some embodiments exposed portion 110 of photoresist layer 101 may become more acidic than the unexposed portion 105 of photoresist layer 101. Thus, exposed portion 110 may be dissolved in a basic solvent. In such embodiments, unexposed portion 105 will not dissolve in the solvent, and thus, portion 105 may form a photoresist pattern. In some embodiments, exposed portion 110 of the photoresist layer 101 may become resistant to being dissolved by a solvent, while unexposed portion 105 of the photoresist layer 101 may be more susceptible to being dissolved by the solvent. This may be the case in embodiments where the photoresist layer 101 is a negative-type photoresist layer. Embodiments described hereinafter are directed at a photoresist pattern formed in a positive-type photoresist layer, where unexposed portion 105 of the photoresist layer serves as the photoresist pattern. It should be understood that the concepts, methods and materials disclosed herein may also apply in embodiments where the photoresist pattern is formed from exposed portion 110 instead. For example, embodiments disclosed herein are generally applicable where the photoresist layer 101 is a negative-type photoresist layer, without loss of generality.

FIG. 1B shows a partial view of a pre-development step 100B in a lithography method, according to some embodiments. After the photoresist layer 101 is exposed (cf. FIG. 1A) pre-development step 100B is applied to the exposed photoresist layer. The pre-development step 100B modifies the portion 105, respectively providing a photoresist pattern 115 and a portion 120. For example, the pre-development step 100B modifies the portion 105 and the portion 110 to reduce attraction forces between the photoresist pattern and any photoresist residue, for example from the portion 110, which may arise when the portion 110 is subsequently removed by a solvent. Such reduction in attraction forces is described in detail below with reference to FIG. 2. Portion 120 may also be dissolved by a solvent capable of dissolving portion 110, according to embodiments disclosed herein. In an example, pre-development step 100B includes treating the exposed photoresist layer 101 with another exposure process. In other words, the portions 105 and 110 are exposed to a second electromagnetic radiation to form photoresist pattern 115. In another example, pre-development step 100B includes treating the exposed photoresist layer 101 with chemicals. In such embodiments, the chemicals used may include an adsorbing chemical that adsorbs to a surface of photoresist pattern 115.

Figure 1C:
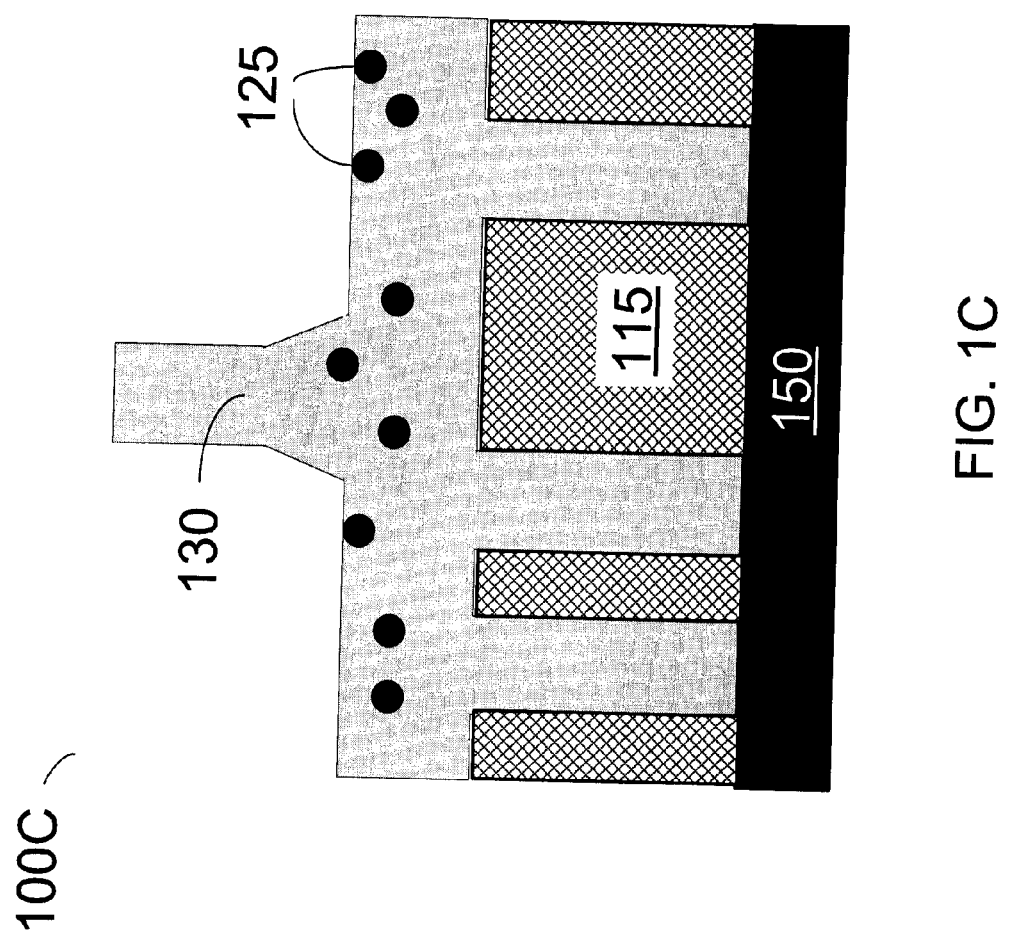
FIG. 1C shows a partial view of a step in a lithography method, according to some embodiments.

FIG. 1C shows a partial view of step 100C in a lithography method, according to some embodiments. In developing step 100C photoresist layer 101 is exposed to a solvent 130, which removes portion 120 of the exposed/pre-treated photoresist layer. Solvent 130 dissolves portion 120 by a chemical interaction, forming residual particles 125. Solvent 130 may include photoresist residual particles 125 suspended in it. In some embodiments, solvent 130 has little or no affinity to photoresist pattern 115, and thus leaves photoresist pattern 115 substantially unchanged. According to embodiments disclosed herein, while solvent 130 interacts strongly with portion 120 to form residual particles 125, solvent 130 may be substantially inert to photoresist pattern 115. Furthermore, in some embodiments consistent with the present disclosure, pattern 115 may have a very weak coupling with residual particles 125. This arises because the interaction forces between the photoresist pattern 115 and residual particles 125 may be substantially reduced by pre-development step 100B (cf. FIG. 1B). Thus, in some embodiments, particles 125 are induced to remain in suspension or dissolved in solvent 130, during developing step 100C.

Figure 1D:
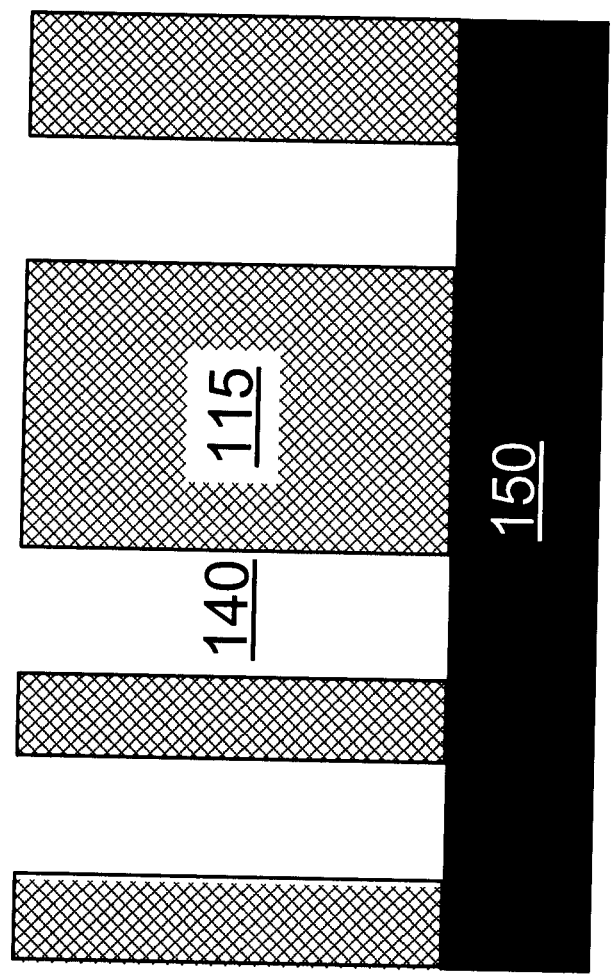
FIG. 1D shows a partial view of a step in a lithography method, according to some embodiments.

FIG. 1D shows a partial view of step 100D in a lithography method, according to some embodiments. A cleaning step 100D may be performed according to FIG. 1D. The resulting wafer in step 100D includes photoresist pattern 115 having openings 140 therein that expose the substrate 150. The photoresist pattern 115 may then be used as an etching mask during an etching process, for example, to etch portions of the exposed substrate 150.

Figure 2:
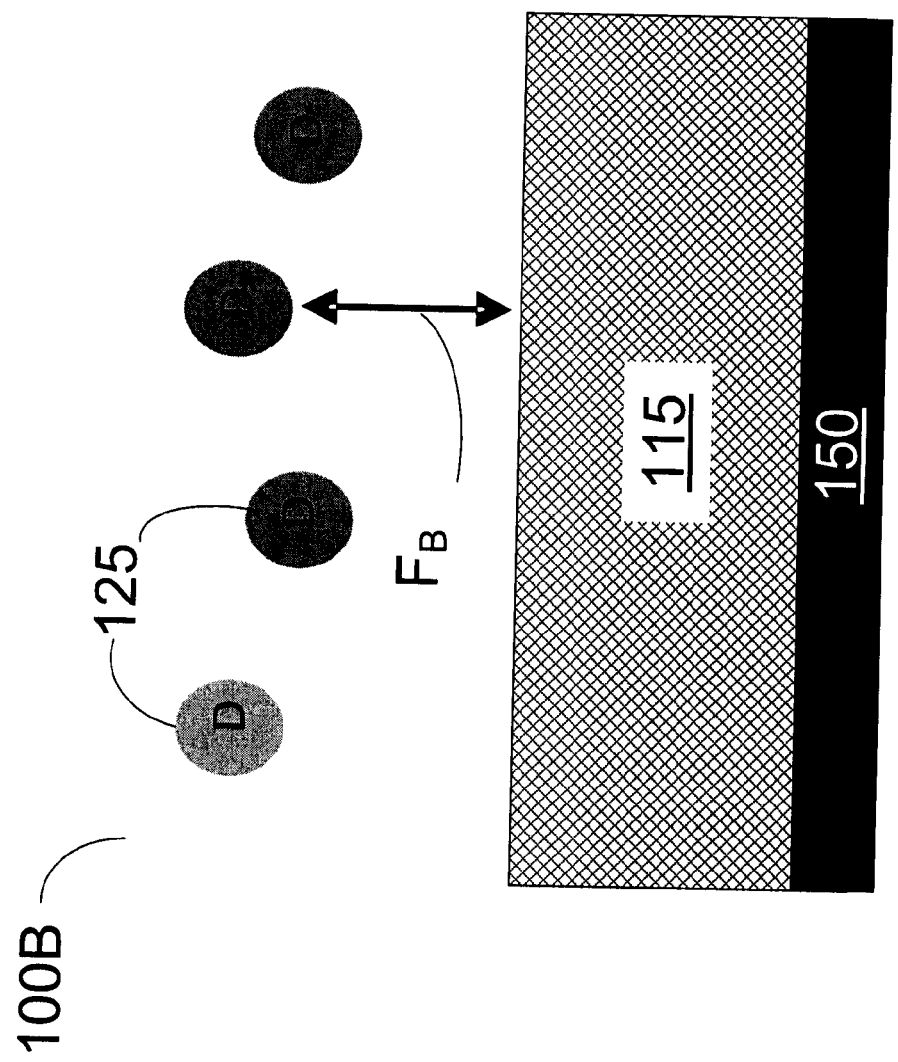
FIG. 2 shows a partial view of a pre-development step, according to some embodiments.

FIG. 2 shows a partial view of pre-development step 100B (cf. FIG. 1B), according to some embodiments. If pre-development step 100B is skipped, a strong attraction force, $F_A$ results between residual particles 125 and exposed portion 105 of the photoresist layer 101. This may lead to coalescence of particles 125 on the surface of exposed portion 105. Particles 125 may be hydrophobic, coalescing and depositing on portion 105. Thus, when exposed portion 105 becomes part of the photoresist pattern, the pattern becomes distorted leading to undesirable etching defects. Currently, attempts to avoid residual particles 125 adhering to portion 105 include the use of additives to increase solubility of particles 125 in solution 130. Some of the additives used conventionally are surfactants, such as soaps, which form a thin film surrounding residual particle 125. Soap and other surfactants typically are molecules having a highly polar hydrophilic portion attached to a non-polar, hydrophobic portion. The film surrounding residual particles 125 has the hydrophilic portion of the surfactant molecule facing solution 130. Solution 130 may include water and other polar solvents. The hydrophobic portion of the film attaches to particle 125, for which it has affinity since particle 125 may also be hydrophobic. The hydrophilic portion of the film is soluble in solution 130 and the complex formed by residual particle 125 and the surfactant film becomes suspended in solution 130. Removal of solution 130 effectively removes residual particle 125 as well. However the interaction of the surfactant or additive, for example, soap, with photoresist pattern 105 may become a problem. Especially in complex wafer manufacturing procedures, the surfactant or additive then accumulates over multiple lithographic procedures. Thus, the surfactant or additive increasingly interacts with portion 105, in addition to covering residual particles 125. Eventually, the surfactant penetrates into portion 105, distorting the photoresist pattern.

The surfactant penetrates into pattern portion 105 similarly to its effect on residual particles 125. Pattern portion 105 may include linked polymer chains after exposure step 100A (cf. FIG. 1A). Typically, polymer links are formed between highly polar OH radicals in the chain, forming hydrogen links with a neighboring polymer. In an environment where a relatively high concentration of surfactant is present, the surfactant molecules destroy the OH—H links between polymers in portion 105. Furthermore, the polar portion of the surfactant attaches to the OH and H radicals in the separate polymer chains, leaving the non-polar portions facing each other in neighboring polymers in pattern 105. This leads to a weak Van der Waals bonding between polymers in portion 105 in the presence of high concentrations of surfactant. The result is the deterioration and dissolution of the pattern formed by pattern portion 105. A manifestation of the deterioration of portion 105 may be observed as a drastic reduction in the glass transition temperature (Tg) of the polymer in 105, in the presence of the surfactant or additive. The glass transition temperature is an indication of the hardness of a polymer layer, and is strongly dependent on temperature. At lower temperatures, polymer layers tend to harden and behave like a glass. This type of behavior is desirable for polymer portion 105 if this is to become a pattern for an etching process. In some cases, a polymer Tg may drop by about 40%: from little above 90° C. to about 55° C., with the addition of between 15% to 20% molar concentration of a surfactant or additive.

To avoid the above problem, embodiments disclosed herein include pre-development step 100B, where a pre-development treatment is performed on portion 105 of the exposed photoresist layer 101. As a result of pre-development step 100B, portion 105 becomes photoresist pattern 115 having the quality of a weak force $F_B$ between residual particles 125 and pattern 120. According to embodiments disclosed herein, $F_B$ is less than $F_A$, and in some embodiments it may be much lower than $F_A$. For example, in some embodiments force $F_B$ may be a factor of ten (10) times smaller than $F_A$. By weakening the attraction force between the photoresist pattern 115 and residual particles 125, the solvent 130 can effectively remove any residual particles 125. Thus, residual particles 125 do not coalesce to photoresist pattern 115.

In some embodiments disclosed herein, pre-development step 100B may be applied to photoresist 101 prior to performing development step 100C (FIG. 1C). Note that in embodiments consistent with the disclosure herein, step 100B may reduce the interaction force between residual particles 125 and photoresist pattern 115 while still allowing solvent 130 to penetrate and dissolve portion 120. Furthermore, in some embodiments consistent with the present disclosure, pre-development step 100B may be performed in the absence of solvent 130, and in the absence of residual particles 125. For example, in some embodiments pre-development step 100B includes treatment of photoresist 101 after exposure step 100A and before developing step 100C (cf. FIG. 1C). In such embodiments, treatment of photoresist 101 forming portion 120 in soluble portions 110 and pattern 115 in pattern portions 105 takes place in the absence of residual particles 125. Thus, particles 125 may be formed by the interaction of solvent 130 with portion 120 in development step 100C (cf. FIG. 1C), in the presence of pattern 115 pretreated according to step 100B.

Figure 3:
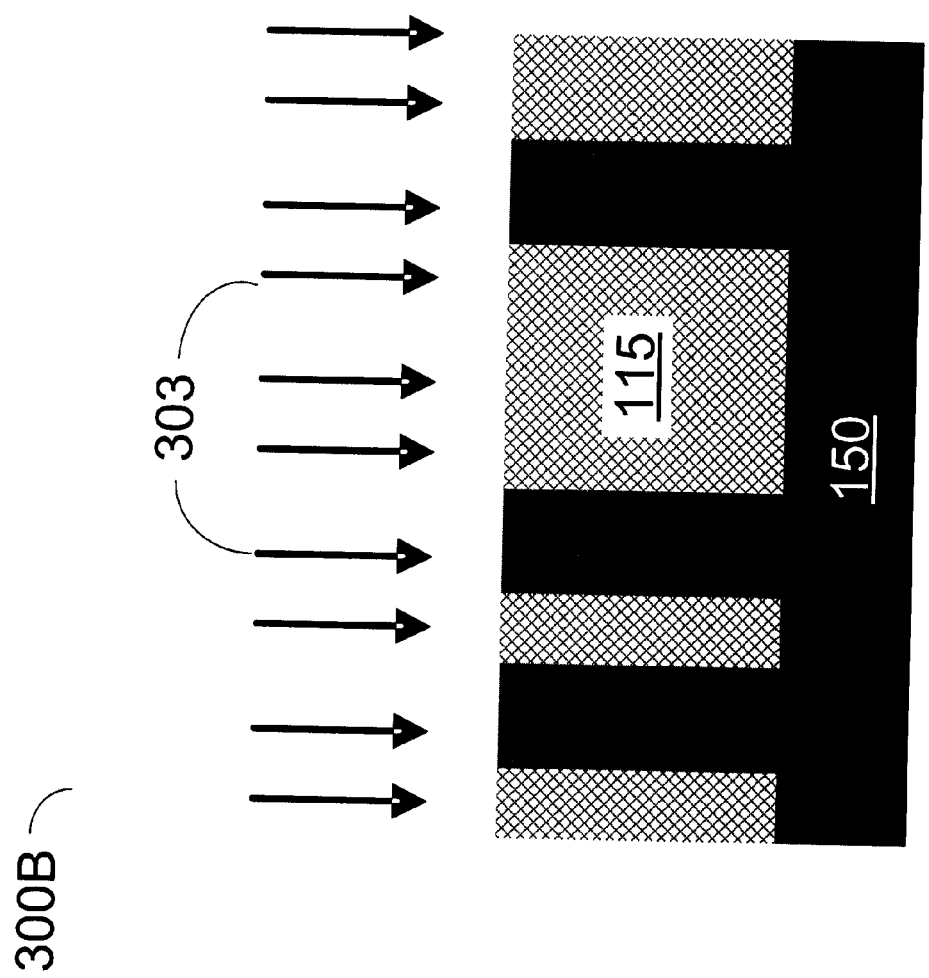
FIG. 3 shows a partial view of a pre-development step according to some embodiments.

FIG. 3 shows a partial view of a pre-development step 300B according to some embodiments. In addition to step 300B a lithography method consistent with embodiments disclosed herein may include exposure step 100A, development step 100C, and cleaning step 100D as described in relation to FIG. 1A, C and D above. In pre-development step 300B electromagnetic radiation 303 is irradiated on photoresist 101 after exposure step 100A (cf. FIG. 1A). The electromagnetic radiation 303 may have a wavelength between about 150 nm and about 700 nm. In embodiments consistent with the present disclosure, radiation 303 may be the same radiation used in step 100A, at a lower dosage level (cf. FIG. 1A). In the depicted embodiment, pre-development step 300B is performed without a mask. Thus, in some embodiments, radiation 303 may impinge on the entire surface of photoresist 101. After pre-development step 300B, portion 105 becomes photoresist pattern 115, which is more hydrophilic than portion 105. Thus, radiation 303 reduces the attraction force $F_B$ between pattern 115 and any residual particles 125 that may arise during a development process. The effect of radiation 303 on pattern 115 may be spread throughout the bulk of a polymer material in photoresist pattern 115. Thus, in a developing step, such as development step 100C (FIG. 1C), not only the top surface of photoresist pattern 115, but also the sidewalls in photoresist pattern 115 may become more hydrophilic, reducing attraction force $F_B$ between photoresist pattern 115 and residual particles 125 in the solution during developing step 100C (cf. FIG. 1C).

Figure 4:
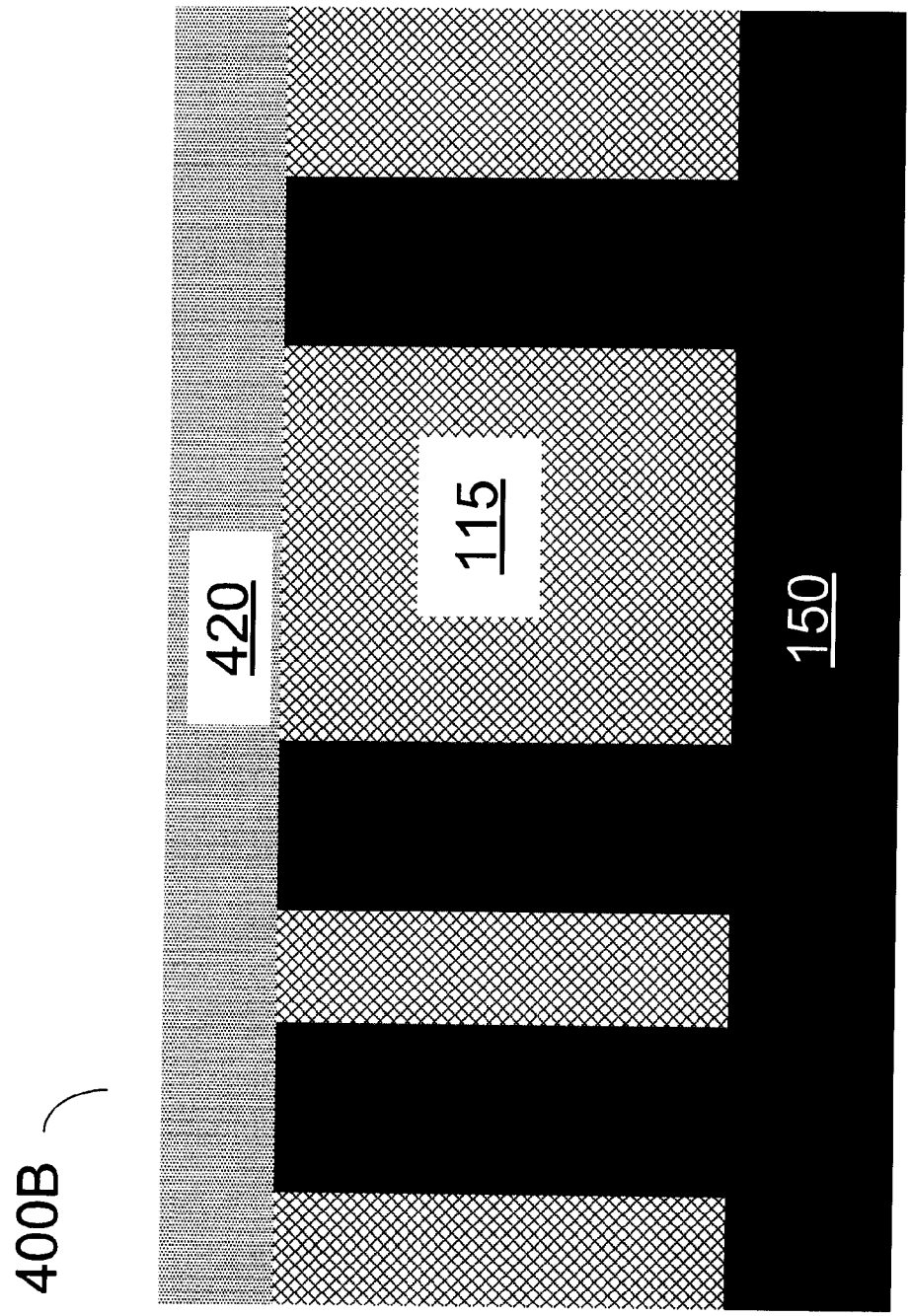
FIG. 4 shows a partial view of a pre-development step according to some embodiments.

FIG. 4 shows a partial view of a pre-development step 400B according to some embodiments. In addition to step 400B a lithography method consistent with embodiments disclosed herein may include exposure step 100A, development step 100C, and cleaning step 100D as described in relation to FIG. 1A, C and D above. In pre-development step 400B, a thin layer of chemical 420 is formed on photoresist layer 101 after exposure step 100A. Chemical layer 420 includes chemicals that can adsorb to the surface of the exposed photoresist layer 101. Chemical layer 420 may have a thickness of about 10 nm. In some embodiments, the thickness of chemical layer 420 is less than 10 nm. Further, according to some embodiments, pre-development step 400B includes depositing a monolayer of material, 'M,' that chemically adsorbs on photoresist layer 101 to form chemical layer 420. In some embodiments consistent with the present disclosure, chemical 'M' may be an adsorbing material having a high affinity for polymers in portion 105 of the exposed photoresist layer 101. As material 'M' is adsorbed on the surface of photoresist layer 101, it forms photoresist pattern 115 from portion 105. Also, material 'M' may form portion 120 from portion 110 (in the depicted embodiment, soluble portions).

According to some embodiments consistent with the present disclosure, chemical 'M' may have a structure as depicted in Formula 1, below:

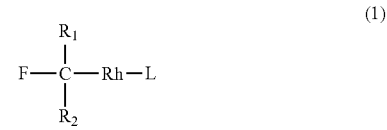

(1)

As shown in Formula 1, chemical 'M' may include a hydrocarbon backbone, 'Rh,' a linking group 'L,' and a repulsive group 'F' with polarity lower than the polymer in portion 105 of the photoresist layer 101. Carbon atom, 'C,' links elements in chemical 'M.' Group 'L' attaches to photoresist pattern 115, and repulsive group 'F' points away from the polymer structure in photoresist pattern 115. Since the polarity of group 'F' is lower than that of polymers in photoresist pattern 115, residual particles 125 will be substantially prevented from adhering to pattern 115 when adsorbing chemical 'M' is attached to the surface of pattern 115. In some embodiments consistent with Formula 1, linking group 'L' may include any one of the following structures: —OH; —OR*, —OC(O)CR*; —SR, —SO$_2$N(R*)$_2$; —SO$_2$R*; SOR; —OC(O)R*; —C(O)OR*; —C(O)R*; —Si(OR*)$_3$; —Si(R*)$_3$; epoxyl groups. In embodiments consistent with disclosures herein R* radical in the above list may be any one of H, an unbranched or branched, cyclic or noncyclic, saturated or unsaturated, alkyl or alkenyl or alkynyl groups. In some embodiments consistent with Formula 1, repulsive group 'F' may include unbranched or branched, cyclic or noncyclic, saturated or unsaturated, alkyl or alkenyl or alkynyl groups. Some embodiments of chemical 'M' consistent with Formula 1 may further include a fluorocarbon in repulsive group 'F.' Some embodiments of chemical 'M' consistent with the present disclosure may also incorporate radicals $R_1$ and $R_2$. According to some embodiments of adsorbing chemical element 'M' consistent with Formula 1, radical groups $R_1$ and $R_2$ may prevent adsorbing molecules 'M' from penetrating into the cross-linked polymer structure of pattern 115. Thus, molecules 'M' may form a monolayer over the surface of pattern 115, while protecting the bulk of pattern 115. Pattern portion 115 is not dissolved by adsorbing molecule 'M.' Solubility depends on at least a polarity matching, solvent environment, and molecular weight. The polarity of adsorbing molecule 'M' is different from the polarity of photoresist in portions 105 and 115. The molecular weight of chemical 'M' (16~500 dalton) is much smaller than the molecular weight of photoresist in portions 105 and 115 (typically ranging from 3000~20000 dalton). According to some embodiments, radicals $R_1$ and $R_2$ may include any one of the following structures: hydrogen (H), unbranched or branched, cyclic or noncyclic, saturated or unsaturated alkyl or alkenyl or alkynyl group. In some embodiments, radicals $R_1$ and $R_2$ may include one of —Cl; —Br; —I; —$NO_2$; —$SO_3$—; —H—; —CN; —NCO, —OCN; —$CO_2$—; —OH; —OR*, —OC(O)CR*; —SR, —$SO_2$N(R*)$_2$; —$SO_2$R*; SOR; —OC(O)R*; —C(O)OR*; —C(O)R*; —Si(OR*)$_3$; —Si(R*)$_3$; epoxyl groups. In the list above, the factor R* may be any one of H, an unbranched or branched, cyclic or noncyclic saturated or unsaturated, alkyl or alkenyl or alkynyl groups. Factor R* may include oxygen, nitrogen, sulfur, carbon, chlorine, bromine, iodine, hydrogen, among other substances. According to some embodiments, factor R* includes atoms coupled by single covalent bonds.

In embodiments consistent with the present disclosure, after chemical layer 420 is formed on top of photoresist layer 101, forming photoresist pattern 115 and portions 120, a development step such as development step 100C may be performed (cf. FIG. 1C). In development step 100C, solvent 130 may flow through thin layer 420 and reach portion 120, thereby dissolving portion 120 (cf. FIG. 1C). Chemical layer 420, including adsorbing chemical 'M,' may spread along the surface of photoresist pattern 115, including not only the top surface as shown in FIG. 4, but also the lateral walls of photoresist pattern 115. As a result, in embodiments consistent with the present disclosure, developing step 100C may dissolve portion 120, forming residual particles 125. Also, since pre-development step 400B forms the chemical layer 420 of adsorbing chemical 'M' on all exposed surfaces of photoresist pattern 115, the attraction force $F_B$ between residual particles 125 and photoresist pattern 115 may be reduced. Thus, in development step 100C residual articles 125 may be removed, leaving substantially no residual particles 125 attached to photoresist pattern 115 (cf. FIG. 1C).

Note that embodiments consistent with the description of FIGS. 3 and 4 do not use an additive or surfactant material dissolved in solvent 130. Alternatively, an additive or surfactant material may be added to the solvent 130. Embodiments consistent with the disclosure herein perform a pre-treatment process to exposed photoresist layer 101 before being subjected to a development step using solvent 130. The pretreatment consistent with FIGS. 3 and 4 substantially reduces the attractive force between the surface of photoresist pattern 115 and residual particles 125. Thus, during a development process, most or substantially all of residual particles 125 may be removed.

Figure 5:
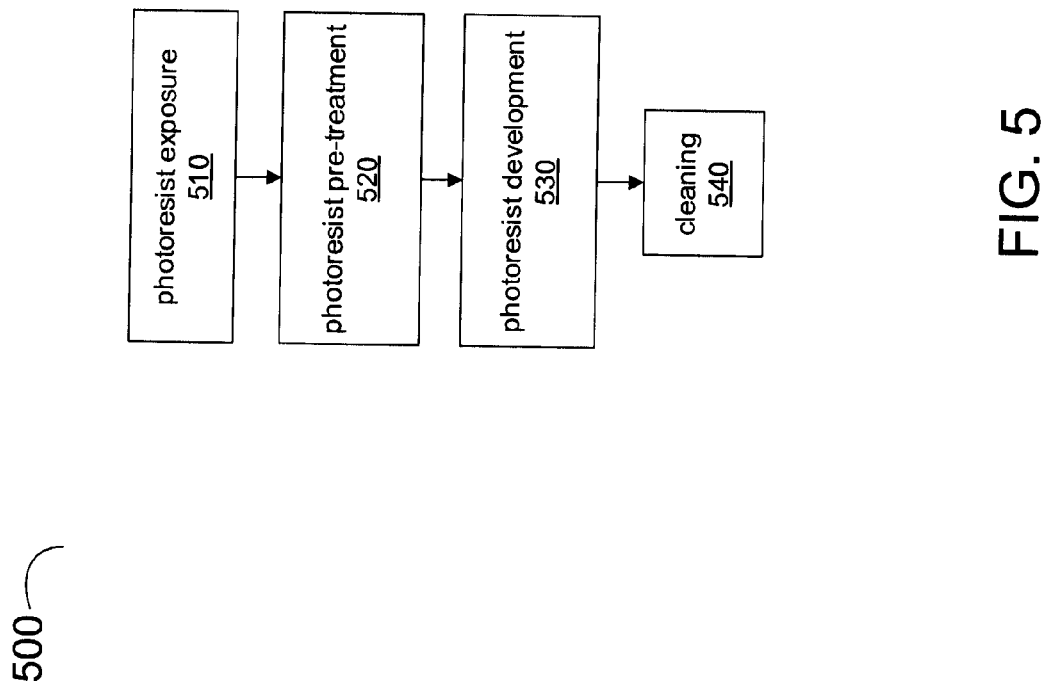
FIG. 5 shows a flow diagram for a method of forming a pattern in a lithography process according to some embodiments.

FIG. 5 shows a flow diagram for a method 500 of forming a pattern in a lithography process according to some embodiments. Method 500 may be used for semiconductor wafer manufacturing according to some embodiments. Method 500 includes a photoresist exposure step 510 where a photoresist layer is formed over a substrate and exposed to radiation to form a pattern portion and a soluble portion. Method 500 may include a photoresist pre-treatment step 520. In some embodiments, step 520 includes treating the exposed photoresist layer so that the surface of the pattern portion has a low attraction force to a non-polar compound. Method 500 may also include a photoresist development step 530. In some embodiments, step 530 includes adding a solvent having high affinity for the soluble portion and low affinity for the pattern portion of the exposed and treated photoresist layer. Method 500 may further include a cleaning step 540. In some embodiments, step 540 includes removing the solvent and the residual particles after the soluble portion has been dissolved by the solvent by a chemical interaction. Thus, a photoresist pattern is formed.

Figure 6:
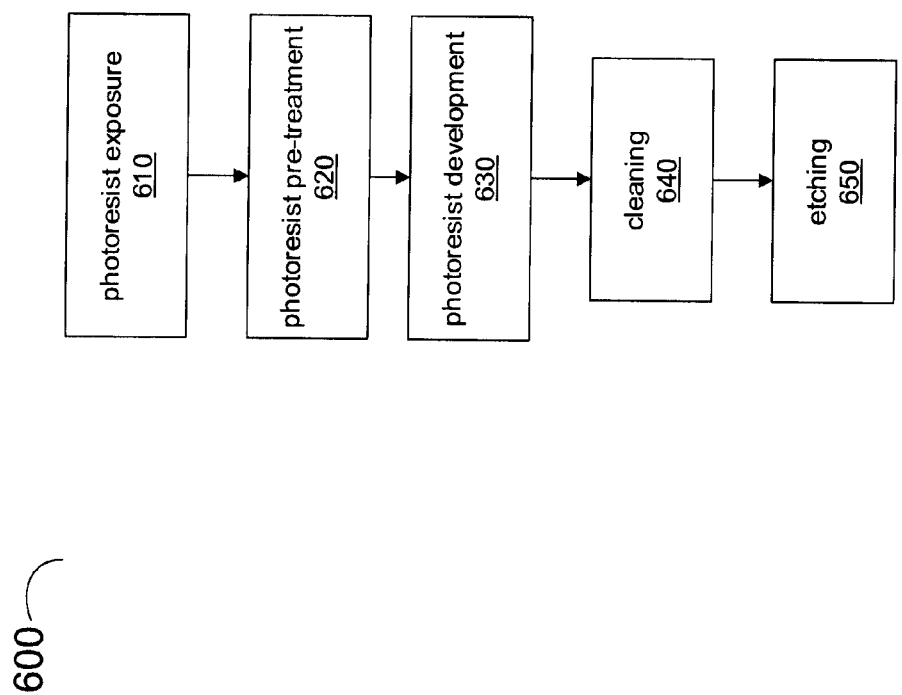
FIG. 6 shows a flow diagram for a lithography method for creating an etching pattern according to some embodiments.

FIG. 6 shows a flow diagram for a lithography method 600 for creating an etching pattern on a substrate material according to some embodiments. Method 600 includes photoresist exposure step 610, photoresist pre-treatment step 620, photoresist development 630 step, and cleaning step 640. In some embodiments of method 600, steps 610, 620, and 630 may be as steps 510, 520, and 530 according to method 500 (FIG. 5). In some embodiments, method 600 may include an etching step 650. Step 650 may include etching the substrate exposed by the photoresist pattern. The etching process may use a chemical having a high etching rate for the substrate material and a low etching rate for the polymers in the photoresist pattern.

A method of forming a pattern in a lithography process for semiconductor wafer manufacturing according to embodiments disclosed herein includes exposing a photoresist (PR) layer on a substrate and treating the exposed PR layer to reduce an attraction force between a portion of the exposed PR layer and a non-polar compound. In some embodiments the method includes adding a solvent having high affinity for a portion of the treated PR layer; and removing the solvent and a plurality of residual particles to form a PR pattern with gaps.

A lithography method for creating an etching pattern on a substrate material in semiconductor wafer fabrication according to embodiments disclosed herein includes exposing a photoresist (PR) layer on a substrate and treating the exposed PR layer to reduce an attraction force between a portion of the exposed PR layer and a non-polar compound. In some embodiments the method includes adding a solvent having high affinity for a portion of the treated PR layer; removing the solvent and a plurality of residual particles to form a PR pattern with gaps; and etching the substrate underneath the PR pattern.

Further according to embodiments disclosed herein an adsorbing material for removing residual particles in a lithography process for semiconductor wafer manufacturing includes a linking group having high affinity for a polymer in a photoresist pattern; a repulsive group having a polarity less than the polymer in the photoresist pattern; a hydrocarbon chain coupled to the linking group and the repulsive group; and a carbon atom coupled to the hydrocarbon chain and the repulsive group.

Embodiments disclosed herein include a pre-development step that is applied to a photoresist after exposure. The pre-development step as disclosed in embodiments herein reduces attraction forces between the photoresist pattern and any photoresist residue, preventing the residue from reattaching to the photoresist pattern. By preventing the residue from attaching to the photoresist pattern, the photoresist residue is effectively washed away during a post-development cleaning step, leaving the desired photoresist pattern in place prior to etching.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

What is claimed is:

1. A method comprising:
   forming a photoresist layer over a substrate;
   exposing the photoresist layer to form soluble portions of the photoresist layer and unsoluble portions of the photoresist layer;
   treating the exposed photoresist layer to reduce an attraction force between the unsoluble portions of the photoresist layer and photoresist residue that arises during developing, wherein the treating the exposed photoresist layer includes forming a chemical layer over the photoresist layer, wherein the chemical layer includes an adsorbing chemical that adsorbs to the photoresist layer; and
   developing the photoresist layer to remove the soluble portions of the photoresist layer, wherein the unsoluble portions of the photoresist layer form a photoresist pattern.

2. The method of claim 1 wherein the treating the exposed photoresist layer to reduce an attraction force between the unsoluble portions of the photoresist layer and photoresist residue that arises during developing includes modifying the hydrophobicity of the exposed photoresist layer, such that the treated and exposed photoresist layer is more hydrophilic than the exposed photoresist layer.

3. The method of claim 1 wherein the treating the exposed photoresist layer to reduce an attraction force between the photoresist layer and photoresist residue that arises during developing includes reducing an attraction force between the unsoluble portions of the photoresist layer and a non-polar compound of the photoresist residue.

4. The method of claim 1 wherein exposing the photoresist layer includes using a mask to expose portions of the photoresist layer to a first radiation.

5. The method of claim 4 wherein the treating the exposed photoresist layer includes exposing the exposed photoresist layer to a second radiation without using a mask.

6. The method of claim 5 wherein the second radiation has a wavelength of about 150 nm and about 700 nm.

7. The method of claim 1 wherein the chemical layer has a thickness less than or equal to about 10 nanometers.

8. The method of claim 1 further including performing a cleaning process on the photoresist pattern.

9. The method of claim 8 wherein the performing the cleaning process on the photoresist pattern includes rinsing the photoresist pattern with a surfactant.

10. The method of claim 1 further including using the photoresist pattern as an etching mask to etch the substrate.

11. A method comprising:
    forming a photoresist layer over a material layer;
    performing a first exposure process on the photoresist layer, thereby forming an exposed photoresist layer having soluble portions and unsoluble portions, wherein the performing the first exposure process includes exposing the photoresist layer to a first radiation having a first wavelength and a first dosage;
    treating the exposed photoresist layer, wherein the treating includes one of:
       performing a second exposure process on the exposed photoresist layer, wherein performing the second exposure process includes exposing the exposed photosensitive layer to the first radiation having the first wavelength and a second dosage that is different than the first dosage; and
       forming an adsorbing chemical layer over the exposed photoresist layer, wherein the adsorbing chemical layer includes an adsorbing chemical that adsorbs to the photoresist layer; and
    developing the exposed and treated photoresist layer to remove the soluble portions of the photoresist layer, wherein the unsoluble portions of the photoresist layer form a photoresist pattern that exposes portions of the material layer.

12. The method of claim 11 wherein:
    the performing the first exposure process includes exposing the photoresist layer to the first radiation using a mask; and
    the performing the second exposure process includes exposing the exposed photoresist layer to the first radiation without using a mask.

13. The method of claim 11 wherein the adsorbing chemical has the following formula:

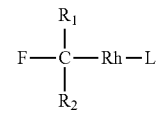

wherein:
   Rh is a hydrocarbon backbone;
   L is a linking group having a high affinity for a polymer in the unsoluble portions of the exposed photoresist; and
   F a repulsive group having a polarity less than the polymer in the unsoluble portions of the photoresist.

14. The method of claim 13 wherein R1 and R2 are selected from a group consisting of —Cl, —Br, —I, —NO$_2$, —SO$_3$—, —H—, —CN, —NCO, —OCN, —CO$_2$—, —OH, —OR*, —OC(O)CR*, —SR*, —SO$_2$N(R*)$_2$, —SO$_2$R*, SOR*, —OC(O)R*, —C(O)OR*, —C(O)R*, —Si(OR*)$_3$, —Si(R*)$_3$, and an epoxyl group, wherein R* is selected from a group consisting of H, an unbranched group, a branched group, a cyclic group, a noncyclic group, a saturated group, an unsaturated group, an alkyl group, an alkenyl group, and an alkynyl group.

15. The method of claim 13 wherein L is selected from a group consisting of —OH; —OR*; —OC(O)CR*; —SR*, —SO$_2$N(R*)$_2$, —SO$_2$R*, SOR*, —OC(O)R*, —C(O)OR*, —C(O)R*, —Si(OR*)$_3$, —Si(R*)$_3$, and an epoxyl group, wherein R* is selected from a group consisting of H, an unbranched group, a branched group, a cyclic group, a noncyclic group, a saturated group, an unsaturated group, an alkyl group, an alkenyl group, and an alkynyl group.

16. The method of claim 13 wherein F is a fluorocarbon.

17. The method of claim 11 further including using the photoresist pattern as an etching mask to etch the exposed portions of the material layer.

18. A material layer for reducing an attraction force between a photoresist layer and residual particles in a lithography process, wherein the material layer includes an adsorbing chemical represented by a formula:

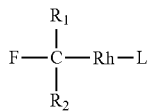

wherein:
- Rh is a hydrocarbon backbone;
- L is a linking group, wherein the linking group has a high affinity for a polymer of an exposed photoresist layer; and
- F is a repulsive group, wherein the repulsive group has a polarity less than the polymer in the exposed photoresist layer.

19. The material of claim 18 wherein R1 and R2 are selected from a group consisting of —Cl, —Br, —I, —NO$_2$, —SO$_3$—, —H—, —CN, —NCO, —OCN, —CO$_2$—, —OH, —OR*, —OC(O)CR*, —SR*, —SO$_2$N(R*)$_2$, —SO$_2$R*, SOR*, —OC(O)R*, —C(O)OR*, —C(O)R*, —Si(OR*)$_3$, —Si(R*)$_3$, and an epoxyl group, wherein R* is selected from a group consisting of H, an unbranched group, a branched group, a cyclic group, a noncyclic group, a saturated group, an unsaturated group, an alkyl group, an alkenyl group, and an alkynyl group.

20. The material of claim 18 wherein L is selected from a group consisting of —OH; —OR*; —OC(O)CR*; —SR*, —SO$_2$N(R*)$_2$, —SO$_2$R*, SOR*, —OC(O)R*, —C(O)OR*, —C(O)R*, —Si(OR*)$_3$, —Si(R*)$_3$, and an epoxyl group, wherein R* is selected from a group consisting of H, an unbranched group, a branched group, a cyclic group, a noncyclic group, a saturated group, an unsaturated group, an alkyl group, an alkenyl group, and an alkynyl group.

21. The material of claim 18 wherein F is a fluorocarbon.

22. The method of claim 11 wherein the performing the second exposure process includes exposing the exposed photoresist layer to the first radiation without using any mask.

* * * * *